United States Patent [19]
Fillion et al.

[11] Patent Number: 5,888,837
[45] Date of Patent: Mar. 30, 1999

[54] CHIP BURN-IN AND TEST STRUCTURE AND METHOD

[75] Inventors: Raymond Albert Fillion; William Edward Burdick, Jr., both of Niskayuna, N.Y.

[73] Assignee: General Electric Company, Schenectady, N.Y.

[21] Appl. No.: 632,858

[22] Filed: Apr. 16, 1996

[51] Int. Cl.⁶ .................................................. H01L 21/66
[52] U.S. Cl. ............................................. 438/15; 438/17
[58] Field of Search .................. 438/14, 15, 17, 438/18

[56] References Cited

U.S. PATENT DOCUMENTS

| | | |
|---|---|---|
| 4,783,695 | 11/1988 | Eichelberger et al. . |
| 4,894,115 | 1/1990 | Eichelberger et al. . |
| 4,933,042 | 6/1990 | Eichelberger et al. . |
| 5,149,662 | 9/1992 | Eichelberger ............................. 438/15 |
| 5,161,093 | 11/1992 | Gorczyca et al. . |
| 5,353,498 | 10/1994 | Fillion et al. . |
| 5,366,906 | 11/1994 | Wojnarowski et al. . |
| 5,367,763 | 11/1994 | Lam ........................................... 438/15 |
| 5,527,741 | 6/1996 | Cole et al. . |

*Primary Examiner*—Kevin M. Picardat
*Attorney, Agent, or Firm*—Ann M. Agosti; Marvin Snyder

[57] ABSTRACT

A burn-in frame having at least one window and including resistors having resistor pads is situated on a flexible layer, and at least one integrated circuit chip having chip pads is situated in the at least one window. Via openings are formed in the flexible layer to extend to the chip pads and the resistor pads. A pattern of electrical conductors is applied over the flexible layer and extending into the vias. The at least one integrated circuit chip is burned in. The burn-in frame may further include fuses, frame contacts, and voltage bias tracks. After burning in the at least one integrated circuit chip, the chip pads can be electrically isolated and the at least one integrated circuit chip can be tested. This method can also be used to burn-in and test multichip modules.

11 Claims, 9 Drawing Sheets

CHIP BURN-IN AND TEST STRUCTURE AND METHOD

BACKGROUND OF THE INVENTION

The widespread use of multichip module (MCM) technologies has been inhibited by the poor yield and infant mortality of untested and unburned-in bare chips. Whereas a single chip package approach has a packaged part yield equal to that of the product of the assembly yield and the chip yield, multichip approaches have packaged part yields equal to the product of the MCM assembly yield and each of the chip yields. A single chip package with an assembly yield of 95% and a die yield of 95% has a package yield of just over 90%. A four chip MCM with the same assembly and die yields has a package yield of less than 80%, and an eight chip MCM with similar yields has a package yield of about 60%. In MCM designs for which rework is impractical, higher final package yields are required and can only be achieved with higher chip yields.

Infant mortality failures create similar concerns. For single chip packaging, individual packaged parts can be burned-in, i.e., powered with active or passive signals on each component I/O (input/output) pad at an elevated temperature to accelerate a significant percentage of latent chip defects that can be identified prior to component use. Bare chips are generally not subjected to burn-in testing prior to use in a multichip assembly.

Growth of the multichip module (MCM) market is thus limited by a lack of low cost known good die (KGD). KGD are singulated die (bare chips) tested and verified to the manufacturer's specification. KGD are functionally equal to packaged counterparts but have significantly higher costs. Currently, KGD have been cost effective only for the most demanding MCM designs.

High density interconnect (HDI) is a high performance chip packaging technology wherein sequential layers of metallization on polymer are used to interconnect chip pads with high chip density, controlled impedance, and the elimination of the need for solder bump, wirebond, or TAB (tape automated bond) processing. In one form of HDI circuit module, an adhesive-coated polymer film overlay having via openings covers a plurality of integrated circuit chips in chip wells on an underlying substrate. The polymer film provides an insulated layer upon which is deposited a metallization pattern for interconnection of individual circuit chips through the vias. Methods for performing a HDI process using overlays are further described in Eichelberger et al., U.S. Pat. No. 4,783,695, issued Nov. 8, 1988, and in Eichelberger et al., U.S. Pat. No. 4,933,042, issued Jun. 12, 1990. Multiple layers of polymer overlays and metallization patterns are typically applied.

Cole et al.,"Fabrication and Structures of Circuit Modules with Flexible Interconnect Layers," U.S. application Ser. No. 08/321,346, filed Oct. 11, 1994, describes a method for fabricating a circuit module using a flexible interconnect layer including a metallized base insulative layer and an outer insulative layer. At least one circuit chip having chip pads is attached to the base insulative layer and vias are formed in the outer and base insulative layers to expose selected portions of the base insulative layer metallization and the chip pads. A patterned outer metallization layer is applied over the outer insulative layer extending through selected ones of the vias to interconnect selected ones of the chip pads and selected portions of the base insulative layer metallization. Because of the metallized layer on the flexible interconnect layer, the number of overlays necessary to achieve the desired interconnections can be reduced and thus the volume and weight of a circuit module can be lowered.

SUMMARY OF THE INVENTION

It would be desirable to have a technique for low cost burn-in and test of integrated circuit chips.

In the present invention, testing and burn-in can be performed using a high density interconnect process on a frame having windows and populated with logic and power components. The processing can provide chip pad reconfiguration to satisfy post test and burn-in chip attach requirements. Furthermore, the processing can be used to eliminate the need to redesign second level assembly printed circuit boards (PCBs) through the use of a discretionary interconnect approach which will accommodate a change in chip geometry or pad layout which can result from chip shrinkages or substitutions of chips from different chip manufacturers.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
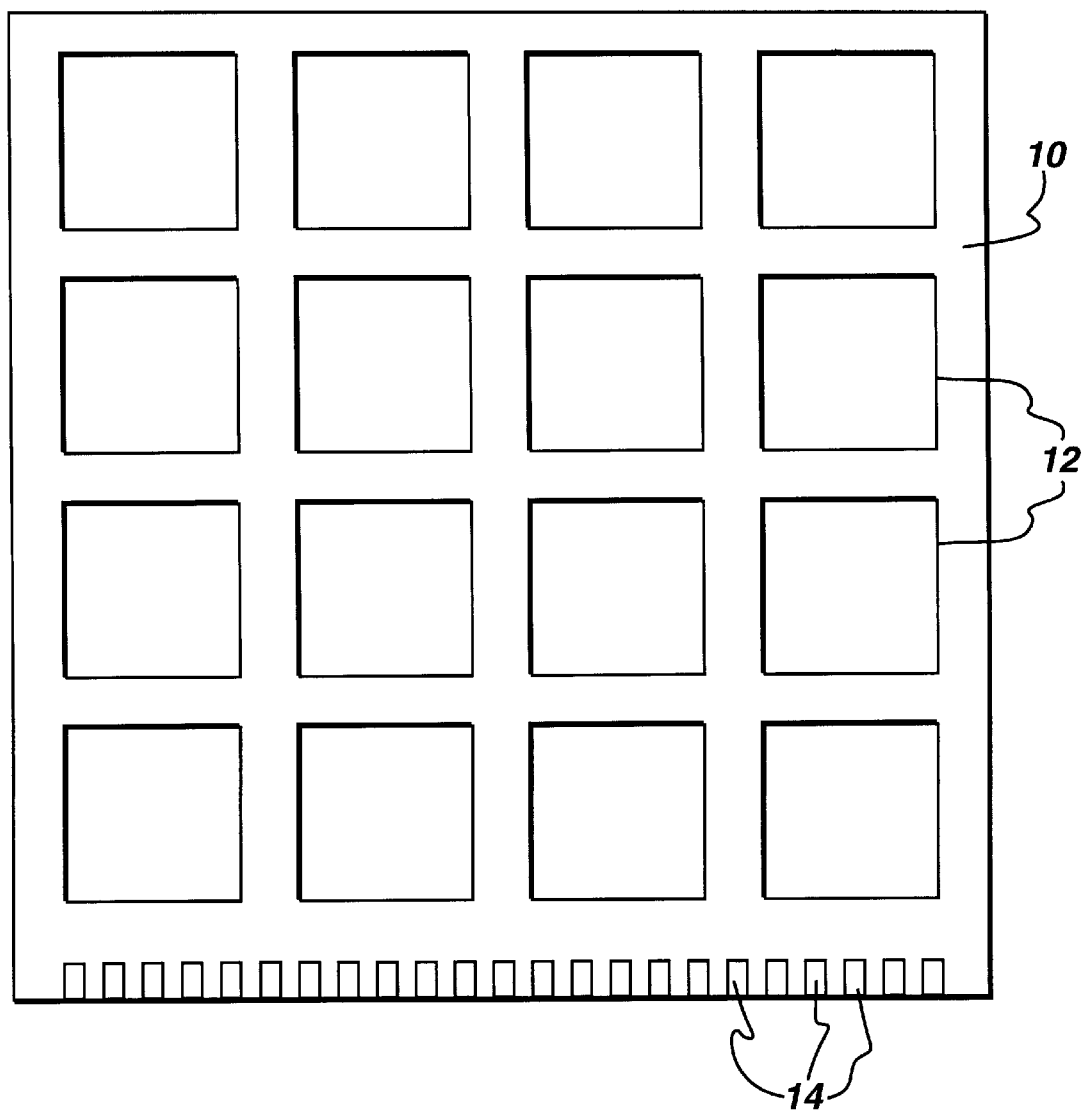
FIG. 1 is a top view of a frame of the present invention.

FIG. 1 is a top view of a frame 10 of the present invention including windows 12 and frame connection pads 14. The frame preferably comprises a material capable of withstanding a desired burn-in environment such as bake cycles of 100° C., 125° C., and 150° C., for example. Such material may include ceramics such as fired ceramics, co-fired ceramics, glass ceramics, alumina, aluminum nitride, and beryllium oxide; insulators on metals such as porcelain, polymer, or diamond film on steel, titanium, or metal matrix composites; metal; metal matrix compositions; or glass/polyimide. The frame has one or more openings that surround a chip (shown in FIG. 3) or multiple chips. In a preferred embodiment, the frame is designed to be reusable.

Figure 2:
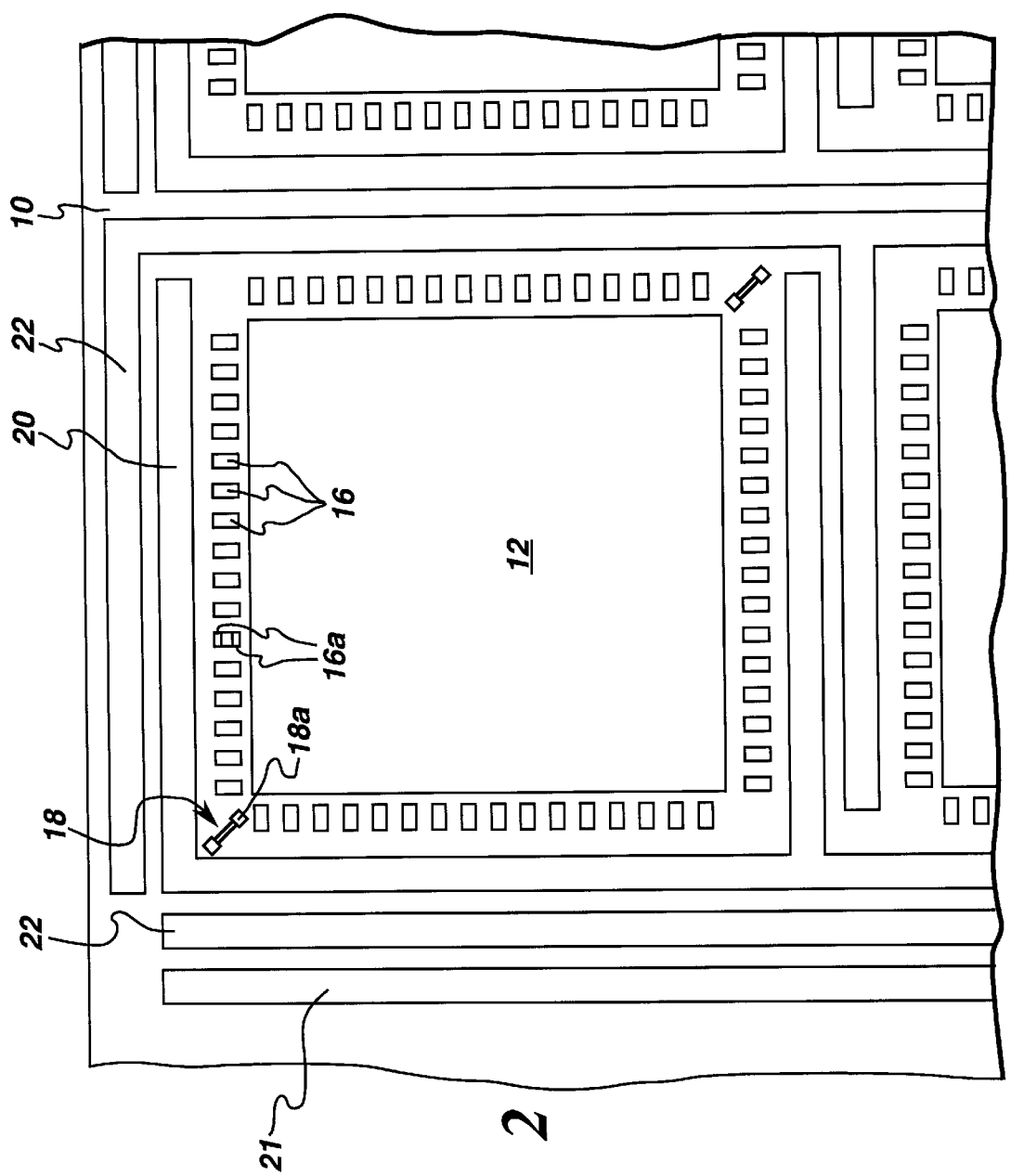
FIG. 2 is a more detailed top view of a portion of the frame of FIG. 1.

FIG. 2 is a more detailed top view of a portion of the frame of FIG. 1 which shows resistors 16 having resistor pads 16a, fuses 18 having fuse pads 18a, a signal track 21, and voltage bias tracks 20 and 22. For simplicity of illustration, resistor pads 16a are shown for only one resistor in FIG. 2. In one embodiment, the frame of FIG. 2 is attached to a flexible layer (shown in FIG. 6) with an adhesive prior to the insertion of any integrated circuit chips in frame windows 12. The adhesive may comprise, for example, a laser-abatable material such as an SPI (siloxane polyimide)-epoxy blend such as disclosed in Gorczyca et al., U.S. Pat. No. 5,161,093, issued Nov. 3, 1992.

Burn-in load resistors and fuses can be situated within or on the surface of frame 10. Typical burn-in networks require a protection resistor connecting each chip input signal pad (or group of input signal pads) and each output signal pad to a respective selected voltage potential or to a respective active (changing) logic level. In addition, current limiting fuse elements can be connected to chip power and ground pads. Resistors 16 may comprise thick film or thin film fired resistor pastes, other thin film deposited materials, discrete resistors, or resistor arrays.

If desired, fuses can be omitted or incorporated into the flexible layer. For example, a narrow metal trace will separate and act as a fuse if a high enough current is applied for a sufficient amount of time. The flexible layer can also contain some resistor elements fabricated either prior to attaching the frame or during interconnect processing after the chips are attached.

Figure 3:
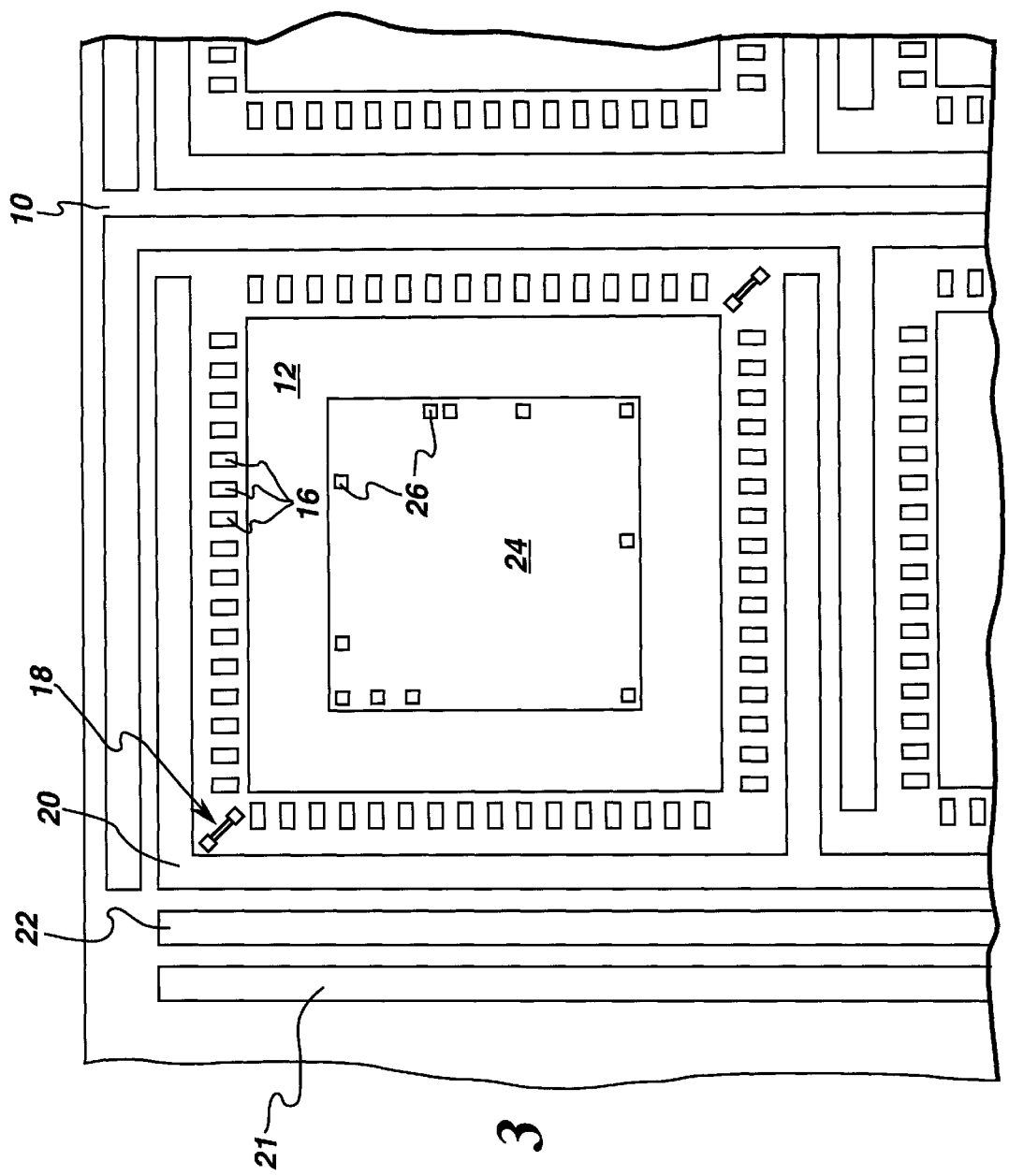
FIG. 3 is a top view of a portion of a frame surrounding an integrated circuit chip.

FIG. 3 is a top view of a portion of a frame surrounding an integrated circuit chip 24 having chip pads 26. In one embodiment, frame 10 is attached resistor side down to the flexible layer, and each integrated circuit chip is attached chip pad side down to the flexible layer through frame windows 12 with an adhesive such as an SPI-epoxy. In another embodiment, the chips can be attached to the flexible layer prior to the addition of frame 10. Frame 10 can then be attached so that the windows appropriately surround the chips. In yet another embodiment, chips can be positioned in frame windows that extend only partly through the frame, and the flexible layer can be applied to the frame and chips simultaneously. This embodiment can provide a heat sink for the chips which is particularly useful for high power chips. This embodiment also offers protection of the back side of the chips during the processing and burn-in. The process of attaching the chips in the windows can include using a chip attach material that is removed with a solvent. The chip attach material can include materials having a softening temperature about twenty to thirty degrees less than the softening temperature of adhesive between the chip and the flexible layer. Cole et al., U.S. Pat. No. 5,434,751, issued Jul., 18, 1995 describes a solvent soluble release layer comprising materials such as soluble polyimides, acrylics, polysulfones, polyesters, and blends, for example. The frame and chip removal requirements of this embodiment cause it to be more costly than the other embodiments.

Electrical connection areas for coupling to external biases and signals can be made from either the frame or metallization on the flexible layer. Frame connections can be made, for example, with edge contact fingers (shown as frame contacts 14 in FIG. 1) or connector pins. These external connection areas can then be inserted into conventional burn-in sockets, for example, for burn-in after the frame and chip interconnections have been formed as discussed below.

Figure 4:
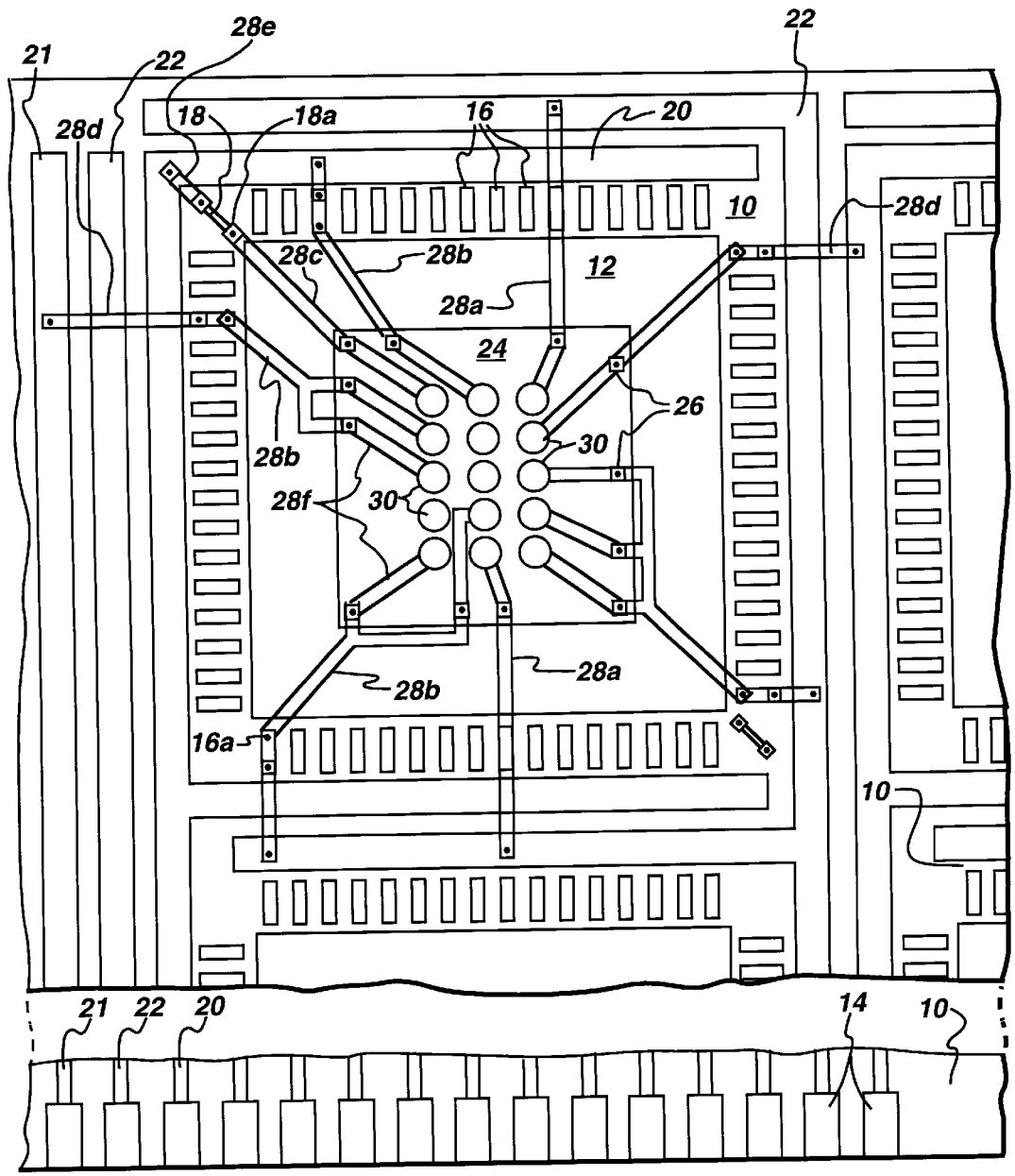
FIG. 4 is a top view similar to that of FIG. 3 and further showing interconnections between chip pads and the frame.
Figure 5:
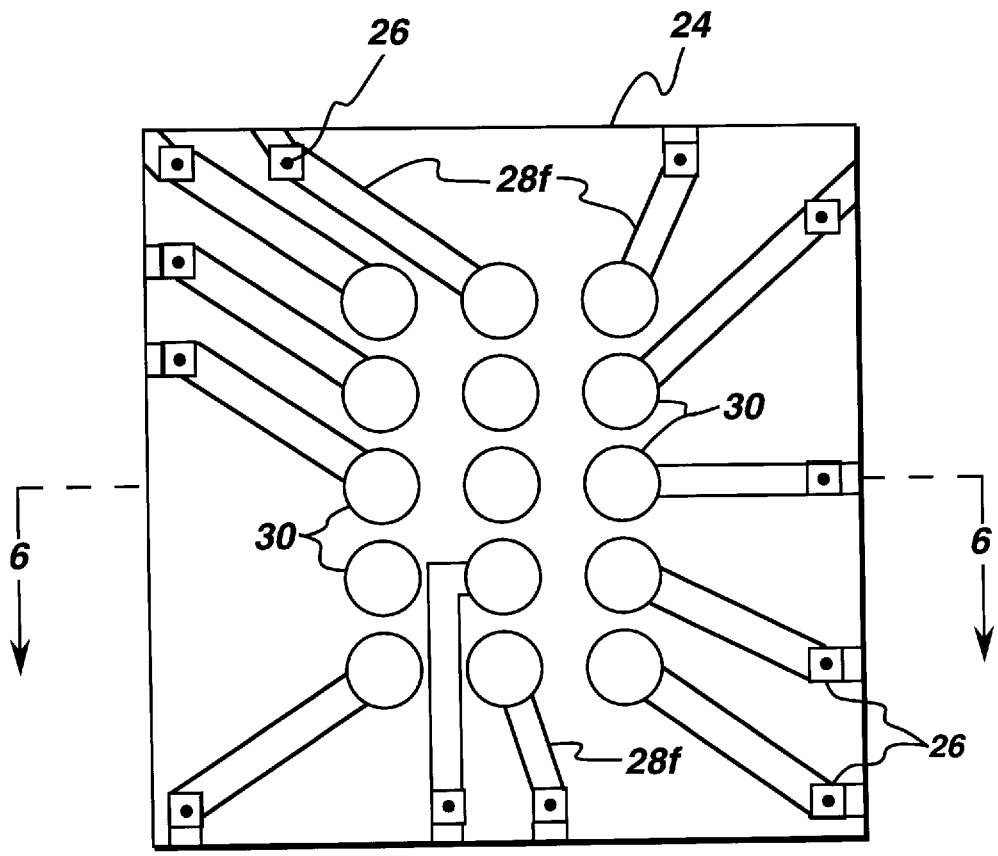
FIG. 5 is a top view of the integrated circuit chip of FIG. 4 after removal from the frame.
Figure 6:
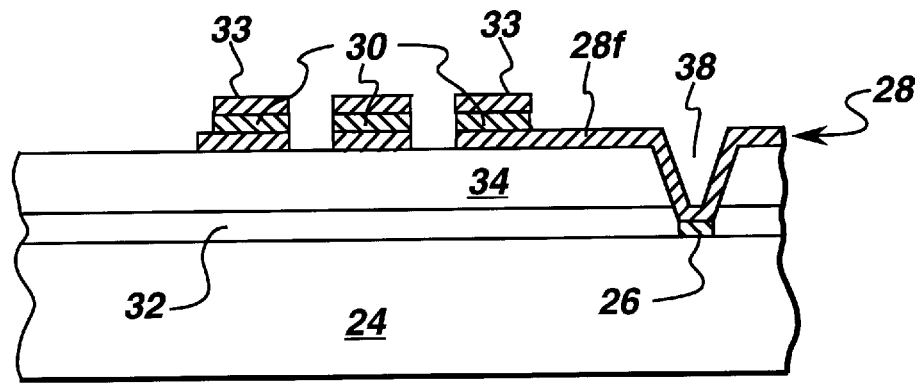
FIG. 6 is a sectional side view along line 6—6 of FIG. 5.

FIG. 4 is a top view similar to that of FIG. 3 and further showing interconnections between chip pads and the frame; FIG. 5 is a top view of the integrated circuit chip of FIG. 4 after removal from the frame; and FIG. 6 is a sectional side view along line 6—6 of FIG. 5.

Flexible layer 34 (shown in the side view of FIG. 6) may comprise an insulating material upon which an electrically conductive material can adhere. Appropriate materials, for example, include polymers such as polyimides. The flexible layer may additionally comprise, if desired, a patterned metallization layer (shown as layer 29 in FIG. 8) on one or both surfaces of the insulating material. In one embodiment, the metallization layer comprises a metal adhesion-promoting seed material such as titanium or $SnCl_2$, followed by an electrolessly applied layer such as copper which can be coated by a thicker electroplated metal layer such as copper.

After the flexible layer is situated adjacent the chips and frame, via openings in the flexible layer extending to the chip pads and the resistors are provided by any appropriate process. A preferred method of laser-drilling vias in a polymer film is described in Eichelberger et al., U.S. Pat. No. 4,894,115, issued Jan. 16, 1990.

Next a pattern of electrical conductors 28 can be applied over the flexible layer and into the vias. Preferably the pattern of electrical conductors includes test and/or reconfiguration pads 30 situated over the flexible layer. In one embodiment, the pattern of electrical conductors 28 can be deposited by sequentially sputtering a thin layer of titanium (for adhesion purposes), sputtering a thin layer of copper, and electroplating a thicker layer of copper (typically ranging from three to ten micrometers). Pads 30 can be deposited by sputtering a material such as gold, palladium, or nickel gold, for example, which will meet the particular application's requirements. Pattern of electrical conductors 28 and pads 30 can be patterned with photoresist to provide the desired connections and pads. As shown in FIG. 4, portions 28a couple chip pads 26 to bias tracks 20 and 22; portions 28b couple chip pads to resistor pads 16a; portions 28c couple chip pads to fuse pads 18a; portions 28d couple resistors to bias or signal tracks; portions 28e couple fuses to bias tracks; and portions 28f couple chip pads to test or reconfiguration pads 30. The bias and signal tracks can extend to frame connection pads 14 which preferably comprise a gold or other noble metal.

The pattern of electrical conductors and/or a patterned metallization layer of a flexible layer can fan-out the chip pads to an array of testable pads located at the flexible layer perimeter or fan-in (as shown) the chip pads 30 to a readily testable pad configuration located within the perimeter of each chip. If pad reconfiguration for the final die package is desired, the fan-in test pad configuration can simultaneously satisfy both the test and second level assembly requirements.

One of the challenges of any burn-in and test process is providing for the number of I/O (input/output) chip pads used in standard burn-in and test systems. In the present invention, the burn-in connections can be made in parallel to I/O chip pads with common functions with the burn-in being accomplished through frame connection pads 14, and a second set of pads 30 can be situated, preferably in the window region, to provide for testing and layout reconfiguration.

Test pads are used to couple chip pads, including input, output, and bias pads, to input, output, and bias test pins of an electronic test system. Generally, each chip pad must be connected separately to a separate test pad, and thus chip pads are not electrically connected together during electrical testing.

Many conventional approaches to burn-in require one burn-in contact per chip pad. In the present invention, the pattern of electrical conductors 28 can connect a plurality of input chip pads together and through a protective resistor to a bias or logic signal; connect each chip output pad to a bias or a logic signal through a protection resistor; and connect each chip bias pad through a current triggered fuse or directly to the bias busses. Thus, in the present invention, burn-in is permitted with only a few bias contacts to frame connection pads.

Because of the interconnect density, each frame can be populated with many chips, each having a large number of I/O chip pads. For the case of a frame with a usable flexible layer area of thirty to forty square inches, several hundred chips could be simultaneously processed through burn-in and test. Standard burn-in only systems utilize parallel connections to reduce the number of burn-in I/O contacts, however, they must rely on multiple layer burn-in boards populated with expensive burn-in sockets including a socket pin per chip contact.

In the case of bare chips, such as silicon integrated circuit chips, the devices are unpackaged and do not have robust contact pins. Instead, bare chips have chip input and output pads that are typically four mils by four mils of thin (one to two microns) aluminum. The aluminum pads generally develop a surface oxide layer that impedes electrical contact. Cost effective, reusable test sockets for high temperature burn-in that do not damage the chip input and output pads are not readily available. Similarly, electrical testing of bare chips requires either probe contacts that damage chip pads or requires expensive bare chip sockets that typically involve excessive manual handling, have poor electrical contacts, and can cause chip damage during handling.

An added expense to standard burn-in systems is the need to remove chips from burn-in boards and install them in test boards to electrically isolate the chips prior to test. This expense does not occur with the present invention. In the present invention, the chips can be electrically isolated by removal of the parallel burn-in connections if they are situated on a disposable portion of the flexible layer. The removal of the burn-in connections can be performed by mechanical techniques, chemical etching, or laser ablation, for example. Once electrically isolated, the test pads can be used for testing without a need for extra handling or a test socket.

Once functionally verified, each chip can be excised from the frame by means of a laser, mechanical punch, water jet, or other precision cutting device. After removal, the flexible layer overlying the chip can remain in position, if desired, and thereby result in a fully tested and burned-in KGD with pads reconfigured as desired and the die surface protected from mechanical damage. This chip scale packaged chip could be directly attached to a PCB, or MCM without need for additional processing.

The pad 30 reconfiguration can be used to convert I/O chip pads from manufacturer unique to universal pad locations and modified to make possible equivalent functionality by substitution of chips from different manufacturers. Each reconfiguration option and process would require a simple and inexpensive change in the chip to interconnect layout, which is unique to each design and located within the boundaries of the chip perimeter. The frame would not require any redesign as a result of a change in I/O chip pad reconfiguration. Therefore, changes in chip pad locations, chip manufacturers, and/or second level assembly requirements do not create the need to redesign burn-in and test hardware.

An option of the present invention is to apply solder 33 to reconfigured pads 30 after burn-in and testing and before each chip is removed from the frame. An inexpensive method of solder application is screen or stencil printing wherein a solder paste is applied to openings in the screen or stencil to desired pad locations using a squeegee. The application can be performed conveniently on a large area such as a wafer, panel, or board and is less costly and time intensive than individually applying solder to pads. Solder applied prior to burn-in can soften and reflow and thus distort the solder form. Electrical testing to solder control pads is not desirable because of the non-planar surface of the solder and the damage that test contacts can cause to the solder. A useful solder paste material 33 for application to pads 30 is a tin/lead eutectic solder. After application of the solder, the frame can be subjected to a standard solder reflow cycle which typically includes baking the frame to drive out any volatile substances from the solder paste and thermally exposing the frame to a temperature sufficient to reflow the solder into a solid solder contact ball that can later be used to attach the chip to a printed circuit board.

Figure 7:
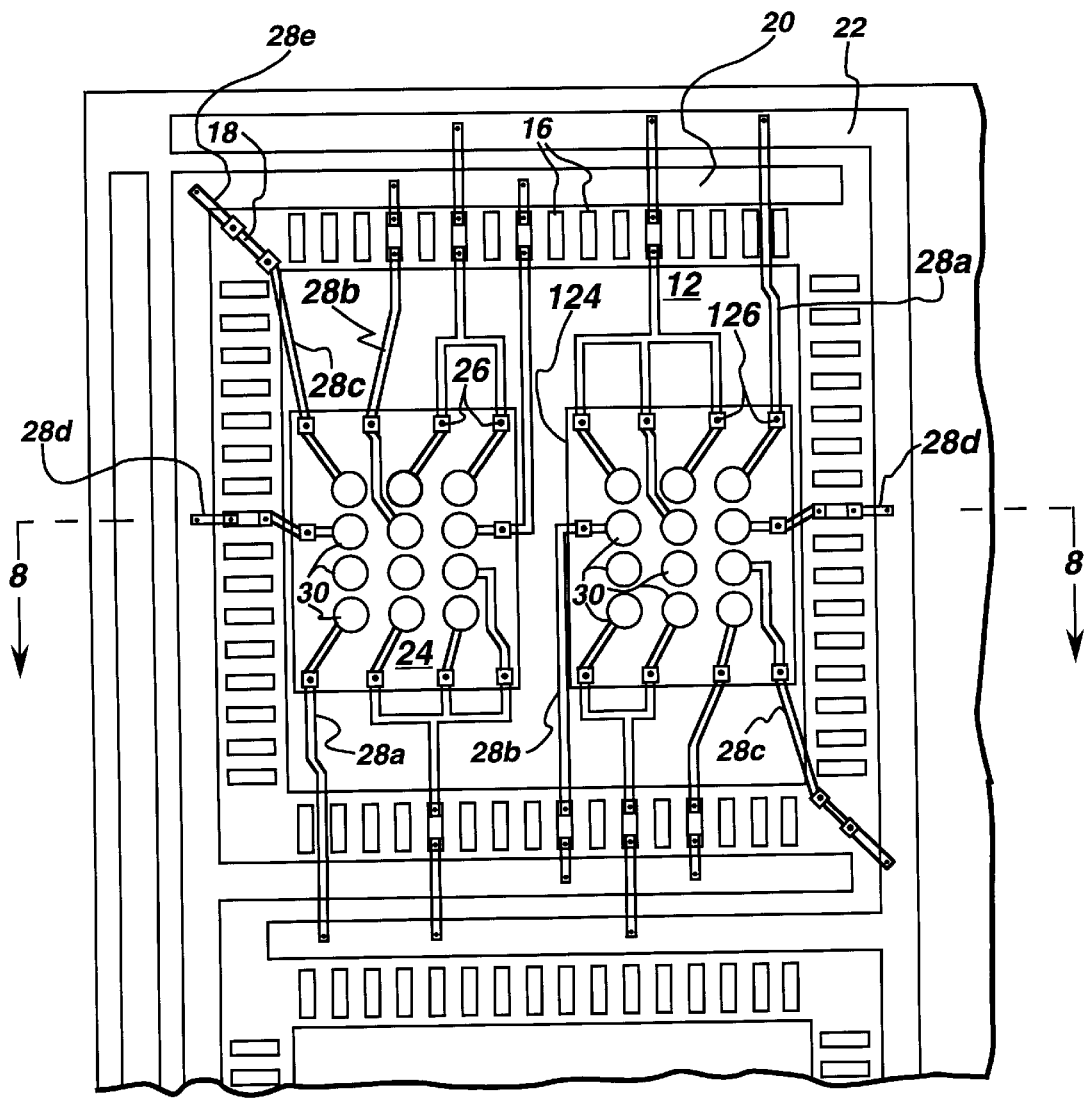
FIG. 7 is a top view of a frame surrounding two chips.
Figure 8:
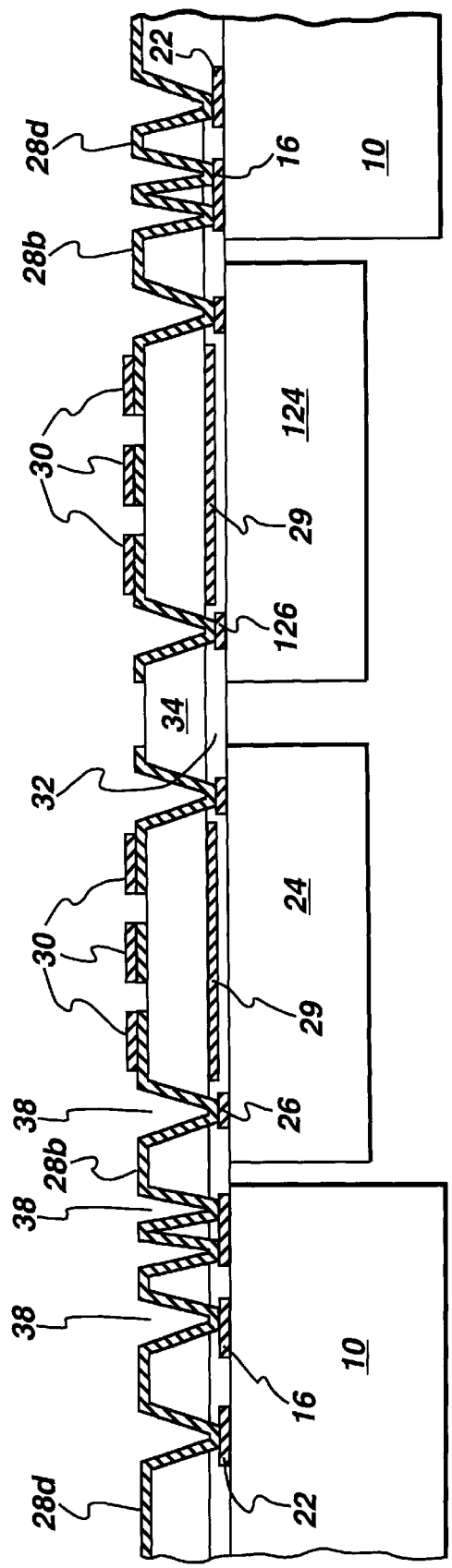
FIG. 8 is a sectional side view along line 8—8 of FIG. 7.

FIG. 7 is a top view of two chips 24 and 124 each having chip pads 26 and 126, respectively, and situated within a single frame opening 12, and FIG. 8 is a sectional side view along line 8—8 of FIG. 7. The positioning of two or more chips within a common frame window increases the number of components that can be incorporated into a fixed frame area. FIG. 8 further illustrates a patterned metallization layer 29 on flexible layer 34.

Figure 9:
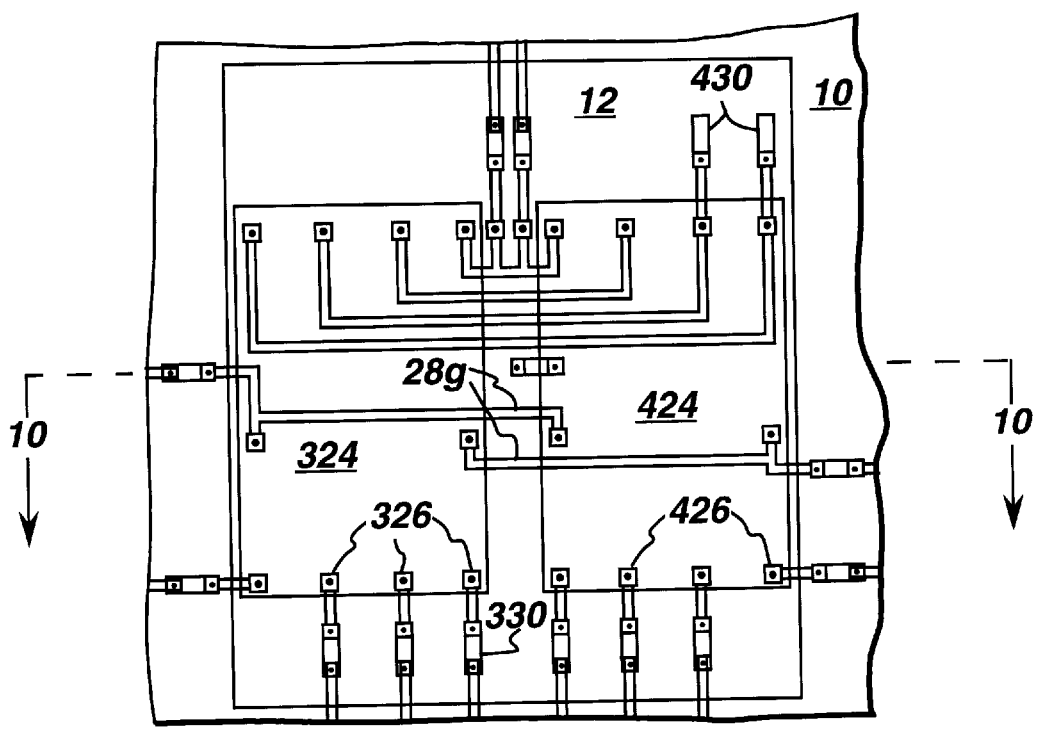
FIG. 9 is a top view of a frame surrounding a multichip module.
Figure 10:
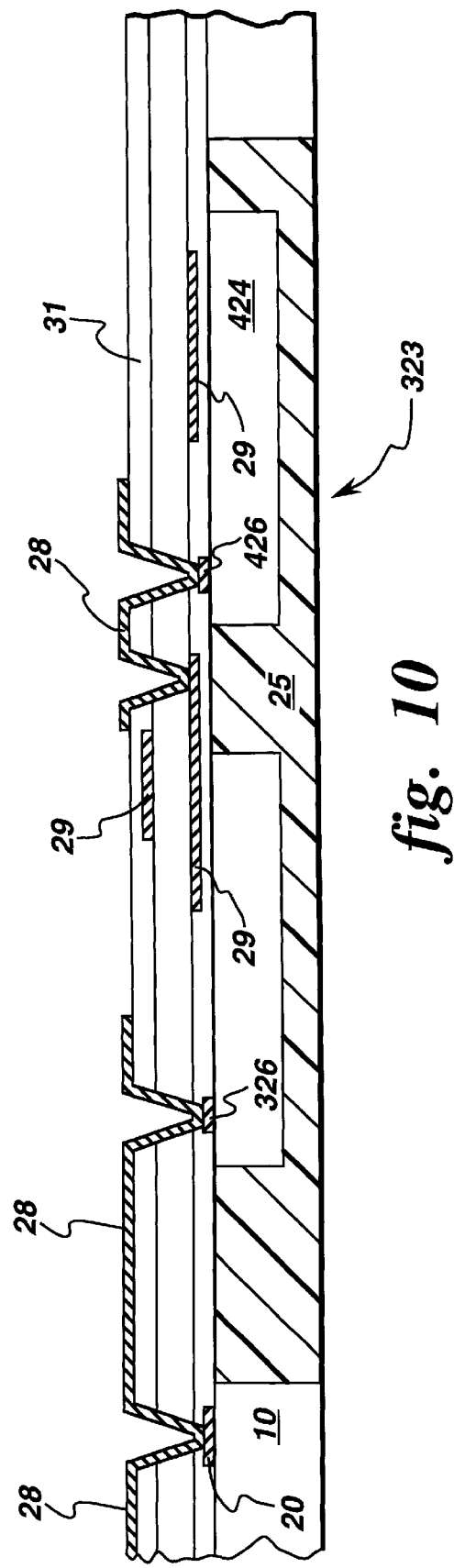
FIG. 10 is a sectional side view along line 10—10 of FIG. 9.

FIG. 9 is a top view of a frame window surrounding two chips 324 and 424 (having module pads 326 and 426, respectively) that are configured to form a multichip module 323, and FIG. 10 is a sectional side view along line 10—10 of FIG. 9. In this embodiment, the flexible layer and pattern of electrical conductors can be used to interconnect the two chips as shown in FIG. 9 by portion 28g of pattern of electrical conductors 28 in addition to providing the electrical interconnections for performing burn-in and providing reconfiguration/test pads.

In another embodiment, the chips in a multichip module are already interconnected prior to being attached to flexible layer 34. In this embodiment, the "module pads" comprise electrically conductive connection pads or portions of electrically conductive material on the multichip module.

In the embodiment of FIG. 10, metallization layers 29 are present on both sides of flexible layer 34, so an additional flexible layer 31 is applied over flexible layer 34 prior to the addition of pattern of electrical conductors 28. Additional flexible layer 31 may be applied in any appropriate manner such as lamination, spray coating, or spin coating, for example, and may comprise a material similar to that of flexible layer 34.

Multichip module 323 includes a substrate 25. Chips 324 and 424 can be positioned in the substrate prior to being attached to flexible layer 34, or, substrate molding material can be applied to surround the chips after being attached to flexible layer 34 in a similar manner as described with respect to Fillion et al., U.S. Pat. No. 5,353,498, issued Oct. 11, 1994. The process of applying molding material can also be useful when a single chip is present in a window because the molding material can help to protect the chip during processing.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A burn-in method comprising the steps of:
   situating a burn-in frame on a flexible layer, the burn-in frame having at least one window and including resistors with resistor pads;
   situating at least one integrated circuit chip having chip pads in the at least one window;
   forming via openings in the flexible layer extending to the chip pads and the resistor pads;
   applying a pattern of electrical conductors over the flexible layer and extending into the vias; and
   burning in the at least one integrated circuit chip.

2. The method of claim 1, wherein the burn-in frame further includes fuses having fuse pads and the step of forming via openings includes forming via openings extending to the fuse pads.

3. The method of claim 2, wherein the burn-in frame further includes bias tracks and the step of forming via openings includes forming via openings extending to the bias tracks.

4. The method of claim 1, wherein the step of situating the burn-in frame occurs prior to the step of situating the at least one integrated circuit chip.

5. The method of claim 1, wherein the step of applying the pattern of electrical conductors includes applying a pattern of electrical conductors including test pads situated over the flexible layer.

6. The method of claim 5, further including the steps of after burning in the at least one integrated circuit chip, electrically isolating the chip pads and testing the at least one integrated circuit chip through the test pads.

7. A burn-in method comprising the steps of:
   situating a burn-in frame on a flexible layer, the burn-in frame having at least one window and including resistors having resistor pads;
   situating at least one multichip module having module pads in the at least one window;
   forming via openings in the flexible layer extending to the module pads and the resistor pads;
   applying a pattern of electrical conductors over the flexible layer and extending into the vias; and
   burning in the at least one multichip module.

8. The burn-in method of claim 7, wherein the step of situating the at least one multichip module comprises situating a plurality of chips having chip pads and a common substrate in the at least one window and the module pads comprise chip pads, prior to coupling the chip pads;
   wherein the step of applying pattern of electrical conductors over the flexible layer includes coupling the chip pads by applying a pattern of electrical conductors that couples selected chip pads of the plurality of chips.

9. The method of claim 7, wherein the step of applying the pattern of electrical conductors includes applying a pattern of electrical conductors including test pads situated over the flexible layer and further including the steps of after burning in the at least one multichip module, electrically isolating the chip pads and testing the at least one integrated circuit chip through the test pads.

10. A burn-in and test method comprising the steps of:
    situating a burn-in frame on a flexible layer, the burn-in frame having at least one window and including resistors having resistor pads, fuses having fuse pads, and voltage bias tracks;
    situating at least one integrated circuit chip having chip pads in the at least one window and on the flexible layer;
    forming via openings in the flexible layer extending to the chip pads, the resistor pads, the fuse pads, and the voltage bias tracks;
    applying a pattern of electrical conductors over the flexible layer and extending into the vias, the pattern of electrical conductors including test pads situated over the flexible layer;
    burning in the at least one integrated circuit chip;
    electrically isolating the chip pads; and
    testing the at least one integrated circuit chip through the test pads.

11. The method of claim 10, wherein the step of applying the pattern of electrical conductors includes positioning the test pads so as to reconfigure a chip pad layout, and
    further including, after burning in and testing the at least one integrated circuit chip, applying a pattern of solder paste to the test pads and reflowing the solder paste into a solid solder contact.

* * * * *